US007859285B2

(12) United States Patent
Sheu et al.

(10) Patent No.: US 7,859,285 B2
(45) Date of Patent: Dec. 28, 2010

(54) DEVICE UNDER TEST ARRAY FOR IDENTIFYING DEFECTS

(75) Inventors: Shing-Ren Sheu, Taoyuan (TW); Chun-Chieh Huang, Hsinchu County (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 35 days.

(21) Appl. No.: 12/145,518

(22) Filed: Jun. 25, 2008

(65) Prior Publication Data
US 2009/0322360 A1 Dec. 31, 2009

(51) Int. Cl.
G01R 31/02 (2006.01)
G01R 31/26 (2006.01)
(52) U.S. Cl. ...................... 324/763; 324/765
(58) Field of Classification Search ............. 324/158.1, 324/763–765, 769–770
See application file for complete search history.

(56) References Cited

U.S. PATENT DOCUMENTS

| 5,576,730 | A | * | 11/1996 | Shimada et al. | 345/98 |
| 6,784,862 | B2 | * | 8/2004 | Kodate et al. | 345/92 |
| 6,836,106 | B1 | * | 12/2004 | Brelsford et al. | 324/100 |
| 6,873,173 | B2 | * | 3/2005 | Kollmer et al. | 324/769 |
| 7,009,418 | B2 | * | 3/2006 | Orii et al. | 324/770 |
| 7,138,817 | B2 | * | 11/2006 | Suzuki et al. | 324/763 |
| 7,145,358 | B2 | * | 12/2006 | Ando | 324/770 |
| 7,298,161 | B2 | * | 11/2007 | Bernstein et al. | 324/769 |
| 7,408,372 | B2 | * | 8/2008 | Agarwal et al. | 324/765 |
| 2003/0107092 | A1 | * | 6/2003 | Chevallier | 257/390 |

* cited by examiner

*Primary Examiner*—Ha Tran T Nguyen
*Assistant Examiner*—Joshua Benitez
(74) *Attorney, Agent, or Firm*—Winston Hsu; Scott Margo

(57) ABSTRACT

A device under test (DUT) array provides defect information rapidly and systematically. The DUT array includes a plurality of test units arranged in a matrix, a plurality of bit lines and a plurality of word lines. Each test unit has a first terminal and a second terminal. Each second terminal of the test unit is electrically connected to a ground point. The first terminals of the test units are electrically connected to the bit lines. The word lines are coupled to the test units. Defects in the each test unit can be identified by providing voltages to the bit lines and the word lines. Accordingly, defects in various devices of an integrated circuit can be detected rapidly and systematically by applying signals to the DUT array.

11 Claims, 4 Drawing Sheets

|  | Acceptable | Fall |
|---|---|---|
| TU$_{1-1}$ (open) | 0 | 1 |
| TU$_{1-2}$ (short) | 1 | 0 |

FIG. 3

| Step | Function | Pre | WLn | PDn |
|---|---|---|---|---|
| 1 | Precharge All | ON | OFF | OFF |
| 2 | Pass-Gate Check | OFF | ON | ON |
| 3 | Precharge All | ON | OFF | OFF |
| 4 | Read | OFF | ON | OFF |

FIG. 4

DEVICE UNDER TEST ARRAY FOR IDENTIFYING DEFECTS

BACKGROUND OF THE INVENTION

1. Field of the Invention

The present invention relates to a device under test (DUT) array for identifying defects and its operating method, and particularly to a DUT array having a plurality of test units arranged in a matrix.

2. Description of the Prior Art

Wafers should continuously undergo tests during manufacturing to maintain the quality of the products. At present, wafer acceptance testing (WAT) is one of the popular test structures. It provides a plurality of test keys in the scribe line area to monitor a variety of defects in the semiconductor processes. As the semiconductor processes are performed to fabricate devices or elements of integrated circuits, a plurality of test structures are simultaneously formed in the scribe line area utilizing the same processes to simulate those devices or elements respectively. Each of the mentioned test structures usually includes two input/output pads. The defects in the integrated circuits therefore can be detected by utilizing probes of the probe card to contact the input/output pads of the test keys over and over. The testing results gain from the probe card for those test structures are important indexes used to indicate the reliability of products.

To identify defects using these test structures, an input signal is provided on one end of the structure and it is determined if an appropriate output signal was generated at the other end. Test structures allow for the testing of "opens" and "shorts". An open is a failure in the connectivity or an excessively high resistance between two allegedly connected points. An open-detecting pattern is typically used to detect opens. A short is a failure when connectivity exists between allegedly unconnected points. An open can be in a metal line, a polysilicon line, a diffusion line, a contact, or a via. A short can be metal-to-metal, polysilicon-to-polysilicon, diffusion-to-diffusion, or contact-to-polysilicon. A short-detecting pattern is typically used to detect shorts.

The above-referenced test structures, i.e. the open-detecting pattern and the short-detecting pattern, have distinct drawbacks. For example, locating and analyzing failures using either structure is difficult and time consuming. Specifically, detecting an open or short condition tells the user nothing about exactly where the defect is located. In addition, the input/output pads of the test structures usually occupy a large area in the wafer, because each input/output pad should be big enough for contacting with probes of the probe card. Since each test structure has two input/output pads, the test structure occupies a large area in the wafer.

Determining the location of the defect requires an inspection or a comparison of the structure by the user. In the current art, visual inspection is a major method of determining chip failure. A visual inspection is a tedious process, which requires considerable time of an experienced product engineer. Moreover, to complicate matters, not all visual defects result in electrical failures. Therefore, to more closely analyze the visual defects, the user must typically perform both optical and scanning electron microscope (SEM) examinations. Furthermore, many defects are not visible by initial inspection, thereby making localization of the defects with an SEM extremely difficult.

Therefore, a need arises for a cost-effective method and test structure to quantify the magnitude of and localize defects on a wafer.

SUMMARY OF THE INVENTION

It is therefore an objective of the present invention to provide a DUT array and the related operating method to solve the above-mentioned problem.

From one aspect of the present invention, a DUT array for identifying defects is disclosed. The DUT array includes a plurality of test units arranged in a matrix, at least a bit line and at least a word line. Each test unit has a first terminal and a second terminal. The second terminals of the test units are electrically connected to a ground point. The bit line is electrically connected to the first terminals of the test units, and the word line is coupled to the test units.

From another aspect of the present invention, a method for identifying defects is disclosed. First, a test system is provided. The test system includes a plurality of test units arranged in a matrix, a plurality of bit lines, a plurality of word lines and at least a sense amplifier. Each test unit has a first terminal and a second terminal. The second terminals are electrically connected to a ground point. The bit lines are electrically connected to the first terminals of the test units, and the word lines are coupled to the test units. The sense amplifier is electrically connected to the bit lines. Subsequently, defects are checked in one of the test unit, which is turned into a selected test unit. The step of checking defects includes: providing a first voltage to one of the bit lines which is electrically connected to the selected test unit; providing a second voltage to one of the word lines which is coupled to the selected test unit so to apply a third voltage to the first terminal of the selected test unit; and reading output signals of the sense amplifier.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 3 is a schematic diagram of a predetermined table of output signals in accordance with the second preferred embodiment of the present invention.

FIG. 4 is a schematic diagram of an operating method of the DUT array in accordance with the second preferred embodiment of the present invention.

DETAILED DESCRIPTION

Figure 1:
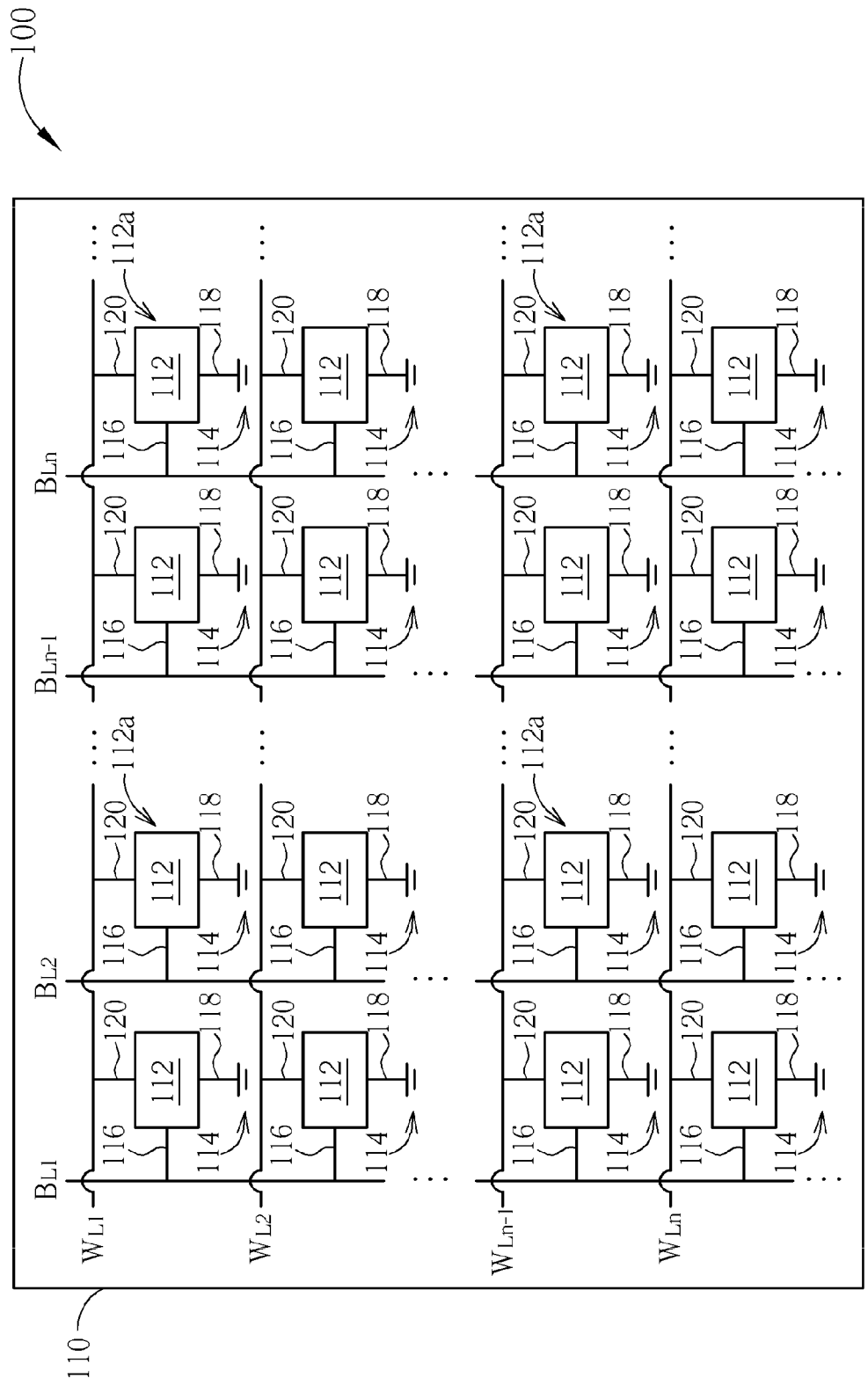
FIG. 1 is a schematic diagram of a DUT array in accordance with the first preferred embodiment of the present invention.

Please refer to FIG. 1. FIG. 1 is a schematic diagram of a DUT array 100 in accordance with the first preferred embodiment of the present invention. The DUT array 100 can be placed on test chips, scribe line areas, or on actual production chips to test manufacturing processes. An array region 110 of the DUT array 100 includes n word lines $WL_1$ to $WL_n$, m bit lines $BL_1$ to $BL_m$, and (n)×(m) test units 112 arranged in a matrix. Note that although only four test units 112 are shown in FIG. 1, actual implementations can include hundreds of test units 112. Each test unit 112 has a first terminal 116, a second terminal 118 and a control terminal 120. Each word line $WL_1$ to $WL_n$ is coupled to the control terminals 120 of the test units 112 in the array region 110. The second terminals 118 of the test units 112 are electrically connected to a ground point 114. Each bit line $BL_1$ to $BL_m$ is electrically connected to the first terminals 116 of the test units 112.

According to the array region 110 of the test system DUT array 100, defects in one of the test units 112 (a selected test unit 112a) can be easily checked by providing a first voltage to the bit line $BL_l$, which is electrically connected to the selected test unit 112a; and providing a second voltage to the word line $WL_l$, which is coupled to the selected test unit 112a. Thus, a third voltage is applied to the first terminal 116 of the selected test unit 112a, so a current can flow through the selected test unit 112a to the ground point 114. In the same way, defects in a plurality of test units 112 can be quickly checked in turn, and the test method can be systematized. In addition, the DUT array 100 can use fewer input/output pads as compared with the prior art. For example, the DUT array 100 including (100)×(100) test units 112 can use two hundred signal input pads to control one hundred bit lines $BL_1$ to $BL_{100}$ and one hundred word lines $WL_1$ to $WL_{100}$, while the prior art ten thousand test structures must use twenty thousand pads.

In the spirit of the present invention, the following drawings illustrate more embodiments of the DUT array. Please refer to FIG. 2, which is a schematic diagram of a DUT array 300 in accordance with the second preferred embodiment of the present invention, where like numbered numerals designate similar or the same parts, regions or elements. The DUT array 300 includes n word lines $WL_l$ to $WL_n$, m bit lines $BL_l$ to $BL_m$, and (n)×(m) test units $U_{1-1}$ to $U_{n-m}$ arranged in a matrix. In this embodiment, the schematic structures of the test units $U_{l-l}$ to $U_{n-m}$ are shown. Each of the test units $U_{1-1}$ to $U_{n-m}$ can include a test pattern 122 and a first transistor 124, such as a MOS transistor. Each test pattern 122 can correspond to at least a semiconductor process to monitor the product element. Each test pattern 122 has a first terminal 117 and a second terminal 118, while the second terminal 118 of the test pattern 122 forms the second terminal 118 of the related test unit. Each first transistor 124 has a source S, a drain D and a gate (a pass-gate) G. The source S forms the first terminal 116 of the related test units; the drain D is electrically connected to the test pattern 122 of the related test unit; and the gate G of each first transistor 124 is electrically connected to the related word line. It is noteworthy that transistors in the present invention can be various kinds of transistors.

Each of the test patterns 122 can be a first testing type for open-detecting, or a second testing type for short-detecting. Accordingly, the first testing type of the test patterns 122 can include a serpentine pattern 126, and the second testing type of the test patterns 122 can include a fork pattern 128. For instance, the test patterns 122 coupled to the word line $WL_{n-m}$ can be the first testing type, while the test patterns 122 coupled to the word line $WL_n$ can be the second testing type. In addition, the DUT array 300 can further include a plurality of pre-charging devices 130 electrically connected to the test units $U_{l-l}$ to $U_{n-m}$ for checking defects in different portions of the test units $U_{1-1}$ to $U_{n-m}$, and a plurality of sense amplifiers 132 electrically connected to the bit lines $BL_1$ to $BL_m$ for characterizing the test units $U_{1-1}$ to $U_{n-m}$. For example, the pre-charging devices 130 can be electrically connected to the first terminals 117 of the test patterns 122.

In regard to the DUT array 300, one of the related operating methods is described as following. First, the DUT array 300 is provided. According to the structure of the DUT array 300, a predetermined table showing the output signals with/without defects located in the DUT array 300 is also provided. In order to identify the test patterns 122, a procedure of checking the pass-gates G can be optionally performed. For checking the pass-gates G of the test unit $U_{1-1}$, the related pre-charging device 130 is turned on, and the related pass-gates G is turned on by providing a voltage to the related word line $WL_1$. If the current path from the related pre-charging device 130 to the related sense amplifier 132 is acceptable, the related signal passes the first transistor 124 of the test unit $U_{1-1}$, and a logic one can be read from the sense amplifier 132 electrically connected to the bit line $BL_1$. Otherwise, a logic zero is read from the sense amplifier 132 electrically connected to the bit line $BL_1$. Thus, all of the pass-gates G can be checked in turn by providing a plurality of voltages to the bit lines $BL_1$ to $BL_m$ and the word lines $WL_1$ to $WL_n$ systematically. Next, the output signals read from the procedure of checking the pass-gates G can be compared with the predetermined table showing the output signals with/without located in the DUT array 300 so as to determine defects in parts except for the test patterns 122.

Subsequently, defects in those test units 112 can be quickly and systematically checked in turn. For checking defects in the serpentine pattern 126 of the selected test unit $U_{1-1}$, a first voltage is provided to the related bit line $BL_1$, and a second voltage is provided to the related word line $WL_1$ so as to turn on the related pass-gates G. As a result, a third voltage is applied to the first terminal 117 of the serpentine pattern 126 in the selected test unit $U_{1-1}$. If the current path from the related bit line $BL_1$ to the ground point 114 of the selected test unit $U_{1-1}$ is acceptable, the related current passes the serpentine pattern 126 of the selected test unit $U_{1-1}$, and a logic zero can be read from the sense amplifier 132 electrically connected to the bit line $BL_1$. If the serpentine pattern 126 of the selected test unit $U_{1-1}$ has an open, a logic one is read from the sense amplifier 132 electrically connected to the bit line $BL_1$.

For checking defects in the fork pattern 128 of the selected test unit $U_{1-2}$, a first voltage is provided to the related bit line $BL_2$, and a second voltage is provided to the related word line $WL_1$ so as to turn on the related pass-gates G. As a result, a third voltage is applied to the first terminal 117 of the fork pattern 128 in the selected test unit $U_{1-2}$. If the structure of the selected test unit $U_{1-2}$ is acceptable, the related current does not pass the selected test unit $U_{1-1}$, and a logic one can be read from the sense amplifier 132 electrically connected to the bit line $BL_2$. If the fork pattern 128 of the selected test unit $U_{1-2}$ has a short, a logic zero is read from the sense amplifier 132 electrically connected to the bit line $BL_2$.

Thus, all of the test patterns 122 can be checked in turn by providing a plurality of voltages to the bit lines $BL_l$ to $BL_m$ and the word lines $WL_l$ to $WL_n$ in turn systematically. Next, the output signals read from the procedure of checking defects in those test units 112 can be compared with the predetermined table showing the output signals with/without defects located in the DUT array 300 so as to determine defects of each test pattern 122.

Figure 2:
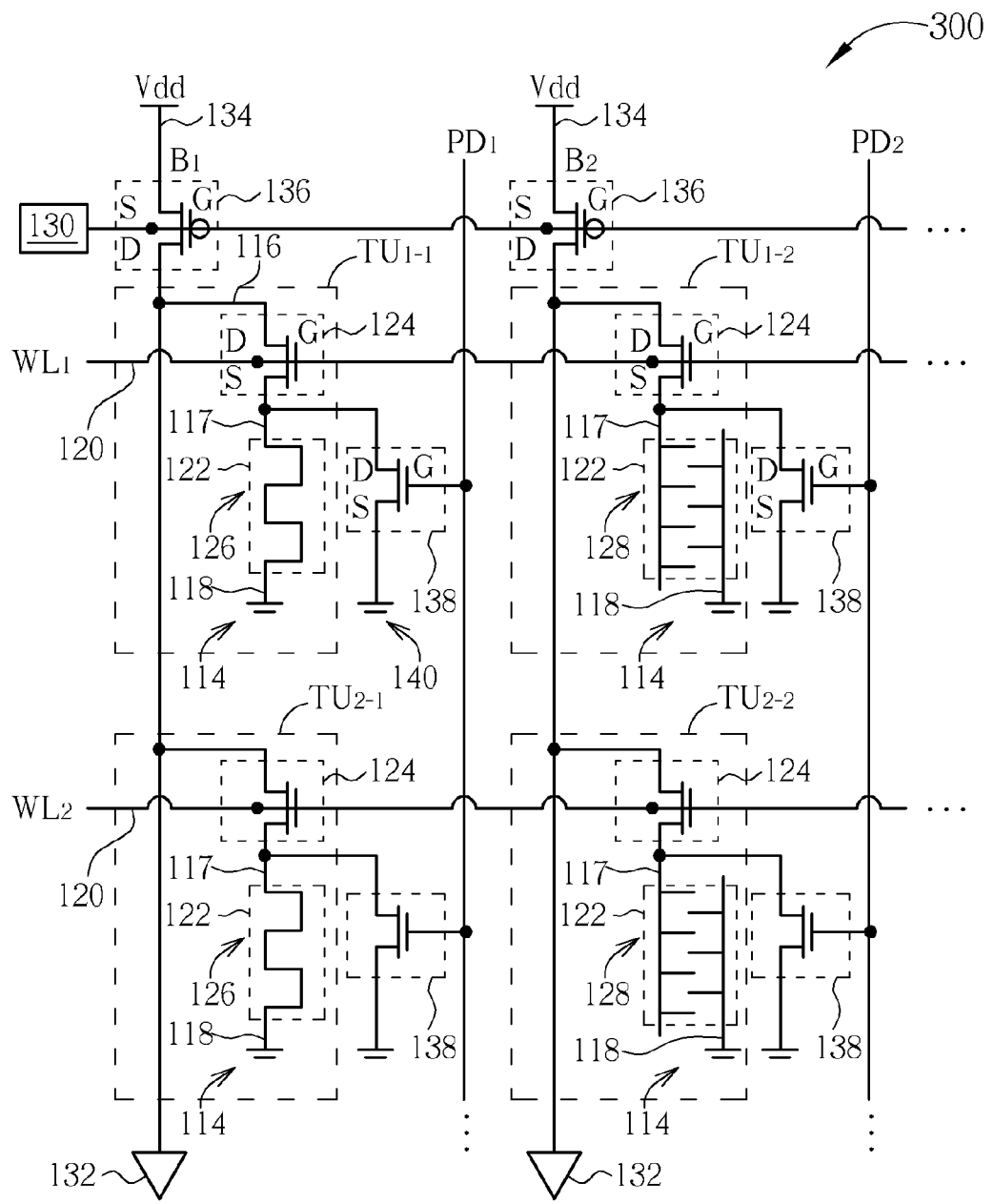
FIG. 2 is a schematic diagram of a DUT array in accordance with the second preferred embodiment of the present invention.

Please refer to FIG. 2, which is a schematic diagram of a DUT array 300 in accordance with the second preferred embodiment of the present invention, where like numbered numerals designate similar or the same parts, regions or elements. The DUT array 300 includes n word lines $WL_1$ to $WL_n$, m bit lines $B_l$ to $B_m$, (n)×(m) test units $TU_{1-1}$ to $TU_{n-m}$ arranged in a matrix, at least a pre-charging device 130 coupled to the bit lines $B_l$ to $B_m$, a plurality of sense amplifiers 132 electrically connected to the bit lines $B_l$ to $B_m$, m controlling lines $PD_l$ to $PD_m$, and a second transistor 136 having a source S, a drain D and a gate G. The second transistors 136 can be P-type metal-oxide-semiconductor transistors (PMOS transistors). Each of the bit lines $B_1$ to $B_m$ can include a power terminal 134 applied to a voltage Vdd. The source S of each second transistor 136 is electrically connected to the power terminal 134; the drain D of each second transistor 136 is electrically connected to the first terminal 116 of the related test unit; and the gate G of each second transistor 136 is electrically connected to the pre-charging device 130. The pre-charging devices 130 can be applied for checking defects in different portions of the test units $U_{1-1}$ to $U_{n-m}$, and the sense amplifiers 132 can be applied for characterizing the test units $TU_{1-1}$ to $TU_{n-m}$.

Each of the test units $TU_{1-1}$ to $TU_{n-m}$ can include a test pattern 122, a first transistor 124 and a third transistor 138. The first transistors 124 and the third transistors 138 can be N-type metal-oxide-semiconductor transistors (NMOS transistors). Each test pattern 122 can correspond to at least a semiconductor process to monitor the product element. In addition, each test pattern 122 has a first terminal 117 and a second terminal 118, while the second terminal 118 of the test pattern 122 forms the second terminal 118 of the related test unit. Each first transistor 124 has a source S, a drain D and a gate (a pass-gate) G. The drain D of each first transistor 124 forms the first terminal 116 of the related test units; the source S of each first transistor 124 is electrically connected to the test pattern 122 of the related test unit; and the gate G of each first transistor 124 is electrically connected to the related word line. Each third transistor 138 has a source S, a drain D and a gate G. The drain D of each third transistor 138 is electrically connected to the first terminal 117 of the test pattern 122 in the related test unit; the source S of each third transistor 138 is electrically connected to a ground point 140; and the gates G of the third transistors 138 are electrically connected to the related controlling line. It is noteworthy that transistors in the present invention can be various kinds of transistors, and should not be limited to this embodiment.

Each of the test patterns 122 can be a first testing type for open-detecting, or a second testing type for short-detecting. Accordingly, the first testing type of the test patterns 122 can include a serpentine pattern 126, and the second testing type of the test patterns 122 can include a fork pattern 128. For instance, the test patterns 122 coupled to the word line $WL_{n-1}$ can be the first testing type, while the test patterns 122 coupled to the word line $WL_n$ can be the second testing type.

In regard to the DUT array 300, one of the related operating methods is described as following. First, the DUT array 300 is provided. According to the structure of the DUT array 300, a predetermined table showing the output signals with/without defects located in the DUT array 300 is also provided, as shown in FIG. 3.

Thereafter, a procedure of checking the pass-gates G can be optionally performed, and another procedure of checking defects in the test units $TU_{1-1}$ to $TU_{n-m}$ can be performed, as shown in FIG. 4. The procedure of checking the pass-gates G includes a step of pre-charging, and a step of checking; and the procedure of checking defects in the test units $TU_{1-1}$ to $TU_{n-m}$ includes a step of pre-charging, and a step of reading the output result.

For checking the pass-gates G of the test units $TU_{1-1}$ to $TU_{n-m}$, the pre-charging device 130 is first turned on to pre-charging all the second transistors 136, while the word lines $WL_1$ to $WL_n$ and the controlling lines $PD_1$ to $PD_m$ are turned off. Immediately, the word lines $WL_1$ to $WL_n$ and the controlling lines $PD_1$ to $PD_m$ are turned on in turn systematically to check each pass-gate G, while the pre-charging device 130 is turned off. Take the test unit $TU_{1-1}$ as an example. If the current path from the related power terminal 134 to the related ground point 140 is acceptable, the related current passes the first transistor 124 and the third transistor 138 of the test unit $TU_{1-1}$, and a logic zero can be read from the sense amplifier 132 electrically connected to the bit line $B_1$. Otherwise, a logic one is read from the sense amplifier 132 electrically connected to the bit line $B_1$. Thus, all of the pass-gates G can be checked in the same way. Next, the output signals read from the procedure of checking the pass-gates G can be compared with the predetermined table showing the output signals with/without located in the DUT array 300 so as to determine defects in parts except for the test patterns 122.

For checking defects in the test patterns 122 of the test units $TU_{1-1}$ to $TU_{n-m}$, the pre-charging device 130 is first turned on to pre-charging all the second transistors 136, while the word lines $WL_1$ to $WL_n$ and the controlling lines $PD_1$ to $PD_m$ are turned off. Immediately, the word lines $WL_1$ to $WL_n$ are turned on in turn to check each the test pattern 122, while the pre-charging device 130 and the controlling lines $PD_1$ to $PD_m$ are turned off. Take the test unit $TU_{1-1}$ as an example. A charge can be provided from the second transistor 136 of the test unit $TU_{1-1}$ due to the pre-charging step, and a second voltage is provided to the related word line $WL_1$ so as to turn on the related pass-gates G of the first transistor 124. As a result, a third voltage is applied to the first terminal 117 of the test pattern 122 in the selected test unit $TU_{1-1}$.

If the structure of the test pattern 122 in the selected test unit $TU_{1-1}$ is acceptable, the related current passes the test pattern 122 of the test unit $TU_{1-1}$, and a logic zero can be read from the sense amplifier 132 electrically connected to the bit line $B_1$. If the test pattern 122 of the selected test unit $TU_{1-1}$ has an open, a logic one is read from the sense amplifier 132 electrically connected to the bit line $B_1$. Thus, all of the test patterns 122 can be checked in turn systematically. Next, the output signals read from the procedure of checking defects in the test units 112 can be compared with the predetermined table showing the output signals with/without defects located in the DUT array 300 so as to determine defects of each test pattern 122.

Since the test units are arranged in a matrix and are controlled by the word lines, the bit lines and so on, a plurality of test units can be quickly and systematically checked. In other embodiments, the DUT array can further include other devices or other circuits electrically connected or coupled to the word lines $WL_1$ to $WL_n$, the bit lines $BL_1$ to $BL_m$, the test units 112, and so on. For example, the DUT array 100 can further include a word line decoder (not shown in the drawings) electrically connected to the word lines $WL_1$ to $WL_n$, a bit line decoder (not shown) electrically connected to the bit lines $BL_1$ to $BL_m$, a voltage generator (not shown) electrically connected to the word line decoder, and so on. The word line decoder is used to turn on/off the appropriate word lines $WL_1$ to $WL_n$, and the bit line decoder is used to turn on/off the appropriate bit lines $BL_1$ to $BL_m$. Note that the circuitry for turning on and off specific decoder is well known in the art and therefore, is not described in detail herein.

It is an advantage of the present invention that the DUT array can use fewer input/output pads as compared with the prior art. Specifically speaking, a DUT array including (n)×(m) test units of the present invention can use (n+m) signal input pads to control n bit lines and m word lines, while the prior art (n)×(m) test structures must use 2×(n)×(m) pads. Therefore, the probe card takes fewer times to contact the input/output pads for detecting the same number of test units. In addition, since the number of the input/output pads is decreased, the area occupied by the input/output pads is also decreased. As a result, the test patterns of the test units can overlap each other and be stacked in a semiconductor device, and the elements density is therefore increased.

It should be noted that as the semiconductor processes are performed to fabricate devices or elements of integrated circuits, the DUT arrays are simultaneously formed utilizing the same processes to simulate those devices or elements respectively. An actual test structure in accordance with the present invention can include lines formed from each conductive layer as well as from a layer of product. The DUT array is disposed in a wafer having a plurality of layers. Therefore, an actual test structure would include multiple layers, and can be stacked on relative locations. In accordance with the present invention, test patterns can be formed from the semiconductor and conductive layers to facilitate identifying defects, i.e. opens and shorts, in the integrated circuit.

Figure 5:
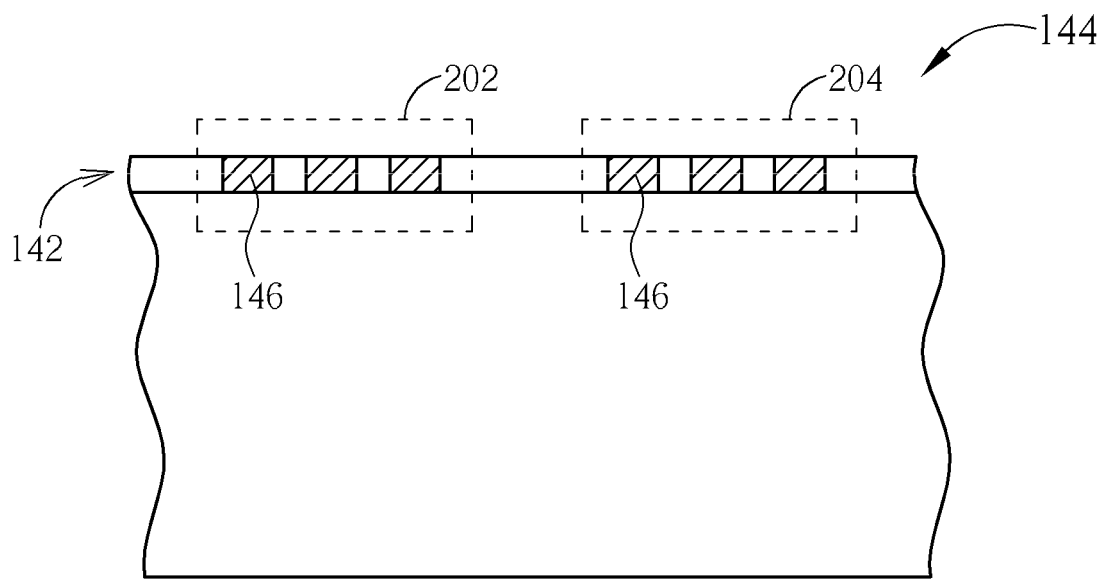
FIG. 5 and FIG. 6 illustrate two schematic cross-sectional diagrams of parts of the DUT array in accordance with two preferred embodiments of the present invention.
Figure 6:
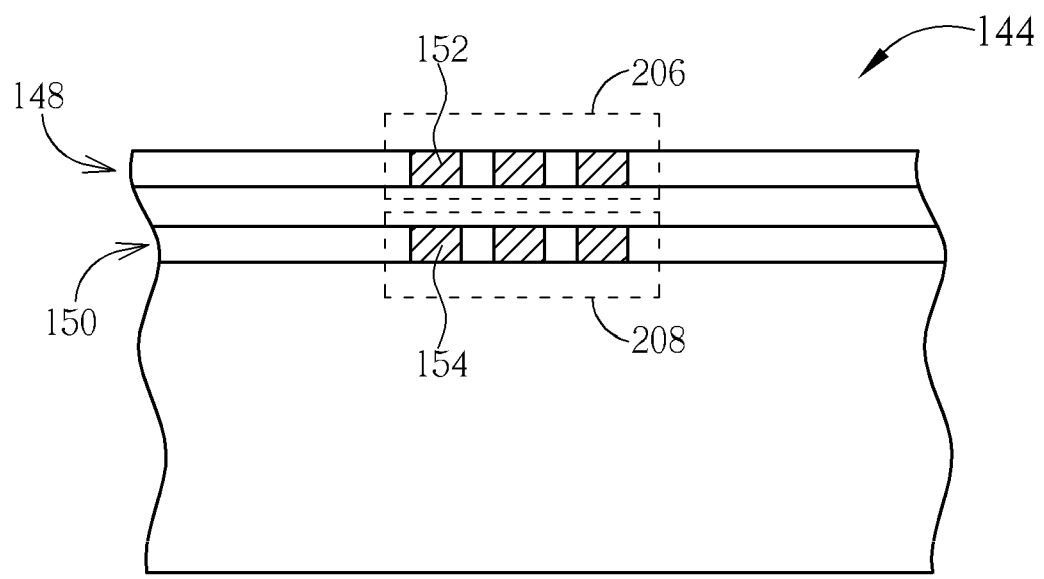

The testing types, the located layers, the fabricating processes, and the forming material layers of two test patterns of the present invention can be the same or different from each other. Please refer to FIG. 5 and FIG. 6, which illustrate two schematic cross-sectional diagrams of parts of the DUT array in accordance with two preferred embodiments of the present invention. As shown in FIG. 5, a DUT array includes a test pattern 202 and a test pattern 204. The test pattern 202 and the test pattern 204 are disposed in one layer 142 of a wafer 144, and can be formed from the same metal layer 146. In other words, the test pattern 202 and the test pattern 204 are disposed at the same level. The test pattern 202 and the test pattern 204 can be the first testing type and the second testing type respectively, the second testing type and the first testing type respectively, both the first testing type, or both the second testing type. As shown in FIG. 6, a DUT array includes a test pattern 206 and a test pattern 208. The test pattern 206 located in a layer 148 is disposed above the test pattern 208 located in a layer 150 of a wafer 144, while the test pattern 206 and the test pattern 208 can be formed from a metal layer 152 and a polysilicon layer 154 respectively. In other words, the test pattern 206 and the test pattern 208 can be stacked. As a result, the occupied area of the DUT array can be effectively reduced.

These embodiments are not intended to be exhaustive or to limit the invention in any way. Those skilled in the art will recognize modifications and variations to the present invention. For example, referring to FIG. 1, the DUT array 100 can be adjusted according to circuits having the similar structures as various read only memories (ROM), various static random access memories (SRAM), etc. Moreover, the positions of the first testing type test patterns and the positions of the second testing type test patterns are not limited to the above embodiments. One bit line can be electrically connected to the test patterns of the same type or to the test patterns of different types, while one word line can be electrically connected to the test patterns of the same type or to the test patterns of different types. One DUT array can include the test patterns of the same type or the test patterns of different types.

The present invention has significant advantages over the prior art. Specifically, defect levels can be detected quickly at minimal expense. Moreover, the location of those defects can be determined. Because of the unique test structure provided, feedback of the test result can be effectively provided for the corresponding process layers. As a result, problems can be quickly analyzed and corrected. In sum, the present invention can achieve:

(1) The high pattern sensitivity due to the in-line defect testing;
(2) Quick yield enhancement due to the high test efficiency and the shorter cycle time of testing; and
(3) Enough process data for new advance technology development.

Those skilled in the art will readily observe that numerous modifications and alterations of the device and method may be made while retaining the teachings of the invention.

What is claimed is:

1. A device under test (DUT) array for identifying defects, the DUT array comprising:
   a plurality of test units arranged in a matrix, each test unit having a first terminal and a second terminal, the second terminals of the test units being electrically connected to a ground point;
   at least a bit line electrically connected to the first terminals of the test units, the bit line comprising a power terminal;
   at least a word line coupled to the test units;
   at least a pre-charging device coupled to the bit line; and
   a second transistor having a source, a drain and a gate, the source of the second transistor being electrically connected to the power terminal of the bit line, the drain of the second transistor being electrically connected to the first terminals of the test units, and the gate of the second transistor being electrically connected to the pre-charging device.

2. The DUT array of claim 1, wherein each of the test units comprises:
   a test pattern having a first terminal and a second terminal, the second terminal of the test pattern forming the second terminal of each test unit; and
   a first transistor having a source, a drain and a gate, the source being the first terminal of each test unit, the drain being electrically connected to the test pattern of each test unit, and the gate of each first transistor being electrically connected to the word line.

3. The DUT array of claim 2, wherein the test patterns comprise a first testing type pattern and a second testing type pattern.

4. The DUT array of claim 3, wherein the first testing type pattern comprises a serpentine pattern which is configured to detect an open defect, and the second testing type pattern comprises a fork pattern which is configured to detect a short defect.

5. The DUT array of claim 2, wherein each of the test units further comprises a third transistor having a source, a drain and a gate.

6. The DUT array of claim 5, wherein the source of the third transistor is electrically connected to the first terminal of the test pattern in each test unit, and the drains of the third transistors are electrically connected to a ground point.

7. The DUT array of claim 6, further comprising at least a controlling line, the gates of the third transistors being electrically connected to the controlling line.

8. The DUT array of claim 2, wherein the test system is disposed in a wafer having a plurality of material layers.

9. The DUT array of claim 8, wherein the test patterns are disposed in one of the material layers of the wafer.

10. The DUT array of claim 8, wherein at least one of the test patterns is disposed above other test patterns.

11. The DUT array of claim 1, further comprising a plurality of signal input pads, each of the signal input pads being electrically connected to the bit line or the word line.

* * * * *